(12) United States Patent
Waller

(10) Patent No.: US 7,032,143 B1
(45) Date of Patent: Apr. 18, 2006

(54) MEMORY DATA PATH CIRCUIT

(76) Inventor: William Kenneth Waller, 2262 N. Greenview Ct., Eagle, ID (US) 83616

( * ) Notice: Subject to any disclaimer, the term of this patent is extended or adjusted under 35 U.S.C. 154(b) by 457 days.

(21) Appl. No.: 10/287,742

(22) Filed: Nov. 5, 2002

(51) Int. Cl.
*G11C 29/00* (2006.01)

(52) U.S. Cl. ..................... 714/718; 365/201

(58) Field of Classification Search ............... 714/718, 714/711, 710; 365/189.05
See application file for complete search history.

(56) References Cited

U.S. PATENT DOCUMENTS

| | | | | |
|---|---|---|---|---|
| 5,450,019 A | * | 9/1995 | McClure et al. | 326/28 |
| 5,986,944 A | * | 11/1999 | Merritt | 365/189.05 |
| 6,049,489 A | * | 4/2000 | Merritt | 365/189.05 |
| 6,163,863 A | * | 12/2000 | Schicht | 714/718 |
| 6,356,487 B1 | * | 3/2002 | Merritt | 365/189.05 |
| 6,560,728 B1 | * | 5/2003 | Merritt | 714/711 |
| 2003/0110425 A1 | * | 6/2003 | Yun | 714/718 |

* cited by examiner

*Primary Examiner*—Albert DeCady
*Assistant Examiner*—John P. Trimmings

(57) ABSTRACT

A memory device with a data path circuit having support in the sense-amp region for compression testing of the device. The data path circuit uses NOR logic compression to provide a scalable design which may be extended to large circuits.

24 Claims, 5 Drawing Sheets

MEMORY DATA PATH CIRCUIT

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

The present invention relates to semiconductor memory devices, and more particularly to circuits useful for transferring data into and out from these devices.

Memory devices are so large and complex that manufacturing defects are likely to exist in any given device. Any defects normally require repair after manufacture, by identifying defective portions of a device, and replacing the function of all defective portions with spare circuits built into the device for this purpose. The cost of test and repair is a significant portion of the total cost of a memory device. Data compression methods can minimize time required for test and repair, thus minimizing this cost component.

Data compression is a technique to speed memory testing by writing and/or reading more memory cells than normal during each memory access. Data compression utilizes simplified test patterns, with many bits written to the same state, such as all ones, all zeroes, bars, or checkerboard, enabling the testing of many cells per access by logical comparison. For example, if all zeroes have been written to a memory, and then the cells are read a dozen at a time, one can detect whether or not the data as read correctly contains all zeroes by gating a logical OR of the data from the dozen cells onto a data line, whereupon the data line signal is zero for test-pass, and one for test-fail. When used this way, the signal on the data line becomes a compressed representation of the data stored in the dozen cells being read.

U.S. Pat. No. 6,163,863, issued Dec. 19, 2000 to Schicht, describes prior art in data compression. This patent implements a compression test mode data path requiring complex first and second stage data compression circuits, as shown in FIG. 5 of the Schicht patent by reference numerals 502, 504, 506, 508, 514 and 516. Using more circuits than necessary has the disadvantages of increasing die size and power consumption, adding wires for interconnect, and causing undesirable differences in electrical parameters, such as additional gate delays, between the circuitry used for testing and that used for normal operation. The Schicht patent has the further disadvantage of using separate wires to feed out compressed test data and normal mode data, making this design difficult to scale up when adding more memory sections to the compression test scheme.

U.S. Pat. No. 6,556,487, issued Mar. 12, 2002 to Merritt, discloses further prior art relevant to the current invention. FIG. 1 illustrates an aspect of compression as disclosed by this patent. FIG. 1 shows four flip-flops 122. In normal mode, each flip-flop drives one of the data bus lines D0–D3. In compression test mode, each flip-flop conveys complementary data to a first-level compression circuit 110. Each first-level compression circuit then feeds a second-level compression circuit 120. The second-level compression circuit then conveys compressed data from the four flip-flops onto data bus lines D2, D3.

The Merritt patent requires the following non-essential elements: separate data bus wires for writing and for reading, more than one level of compression circuits, wiring for interconnecting compression circuits, dummy devices to balance loads on both sides of the flip-flop, and an output circuit for separating the signals from the flip-flop. These non-essential elements have the disadvantages of increasing die size and power consumption without improving performance. The design disclosed by the Merritt patent has the further disadvantage of requiring added device loading on the data bus lines to support compression. As shown in FIG. 1, compression circuit 120 adds both p-type device and n-type device loading on data bus lines D2 and D3. This added loading inevitably slows down the read cycle. The Merritt design has the further disadvantage that it is not easily scalable by adding more memory sections to the compression scheme, since it requires more wires when adding more compression circuit blocks.

BRIEF SUMMARY OF THE INVENTION

The circuit of the current invention conveys read-cycle data in a memory device from sense amplifiers to data bus wires which form part of a signal path for conveying the data off the device. The design provides a normal operating mode and a compression test mode, and uses a single data bus for read data and for write data in both modes.

The current invention conveys compressed test data out of the memory as complementary signals on pairs of the data bus wires. The portion of memory being read shows valid operation when such a pair of data bus wires has complementary or opposite values during a read cycle in compression test mode. The portion of memory being read shows erroneous operation when the same values are read on both wires of the pair. In a read cycle in normal operating mode, each data bus wire conveys the value from a single memory cell being read, so data bus wires are not evaluated as complementary pairs in normal operating mode, but as mutually independent logic values instead.

The current invention implements complementary and single-ended signals with less circuitry than prior art, thus providing the advantages of smaller device size, less operating power, and greater speed. These advantages are achieved by omitting the separately wired test data write lines and the extra compression stage from the Schicht patent, and by omitting entirely the following elements of the Merritt patent: the dummy devices adjacent the flip flop whose sole purpose is to balance the capacitive loading on both sides of the flip flop, the flip-flop output circuit, the separate wiring for read and write data paths, and the extra compression circuitry 120 in FIG. 1. The current invention does not increase capacitive load on the data bus wires when adding compression test mode capability to normal mode, according to the preferred embodiment. The smaller data bus wire capacitive load of the current invention thus gives the advantage of improved speed and power performance as compared to prior-art designs.

Thus the objects and advantages of the current invention are:

1. a memory read data path providing both a normal operating mode and a compression test mode using fewer devices than prior art, for example eliminating any need for compression circuit 120 of FIG. 1,
2. a memory read data path using the same set of data bus wires for reading and for writing data in both compression test mode and in regular operation,
3. a memory read data path with less capacitive load on data bus wires than prior art,
4. a memory read data path implementing compression test mode by adding as little as a single signal inversion for each pair of bits being read, to the normal mode design,
5. a memory read data path performing precharge of the data bus lines to a logic high state prior to, or concurrent with, the early stages of a read cycle, thus minimizing delay of read cycle timing,
6. a memory read data path using only n-type devices to switch the data bus lines after precharge, reducing device loading on the data bus lines since a pullup transistor is not needed for each flip flop.
7. a memory read data path using the same switching devices for each data bus wire in both compression test mode and in regular operation,
8. a memory read data path having compression test mode read cycle timing as fast as, or faster than, normal mode read cycle timing, and
9. a memory read data path compressing data by logical OR, and alternatively logical NOR, of compression data from different memory sections and from the same memory section with no additional wires or controls, providing a design that easily scales up to higher compression ratios.

DETAILED DESCRIPTION OF THE INVENTION

Figure 1:
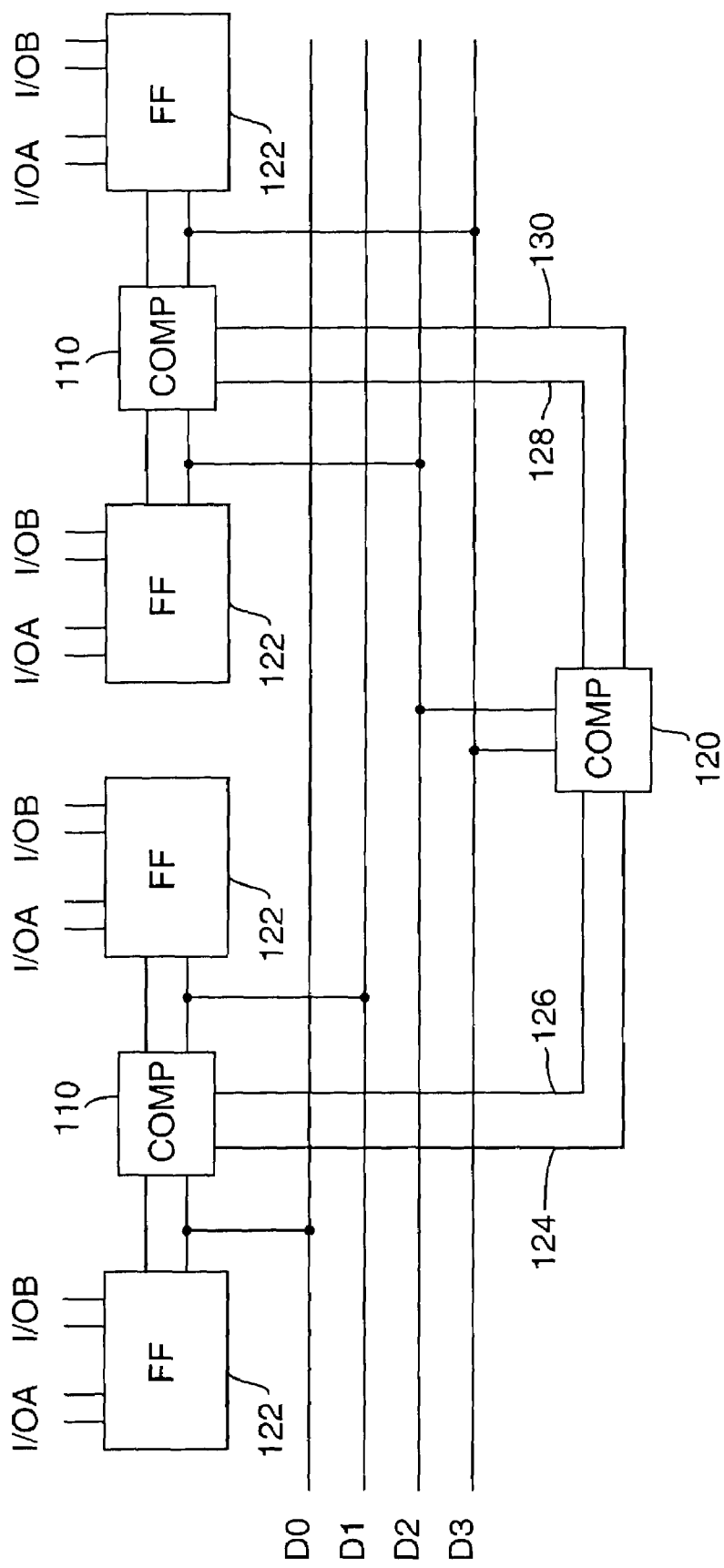
FIG. 1 shows a prior-art compression design having two levels of compression circuits.
Figure 2:
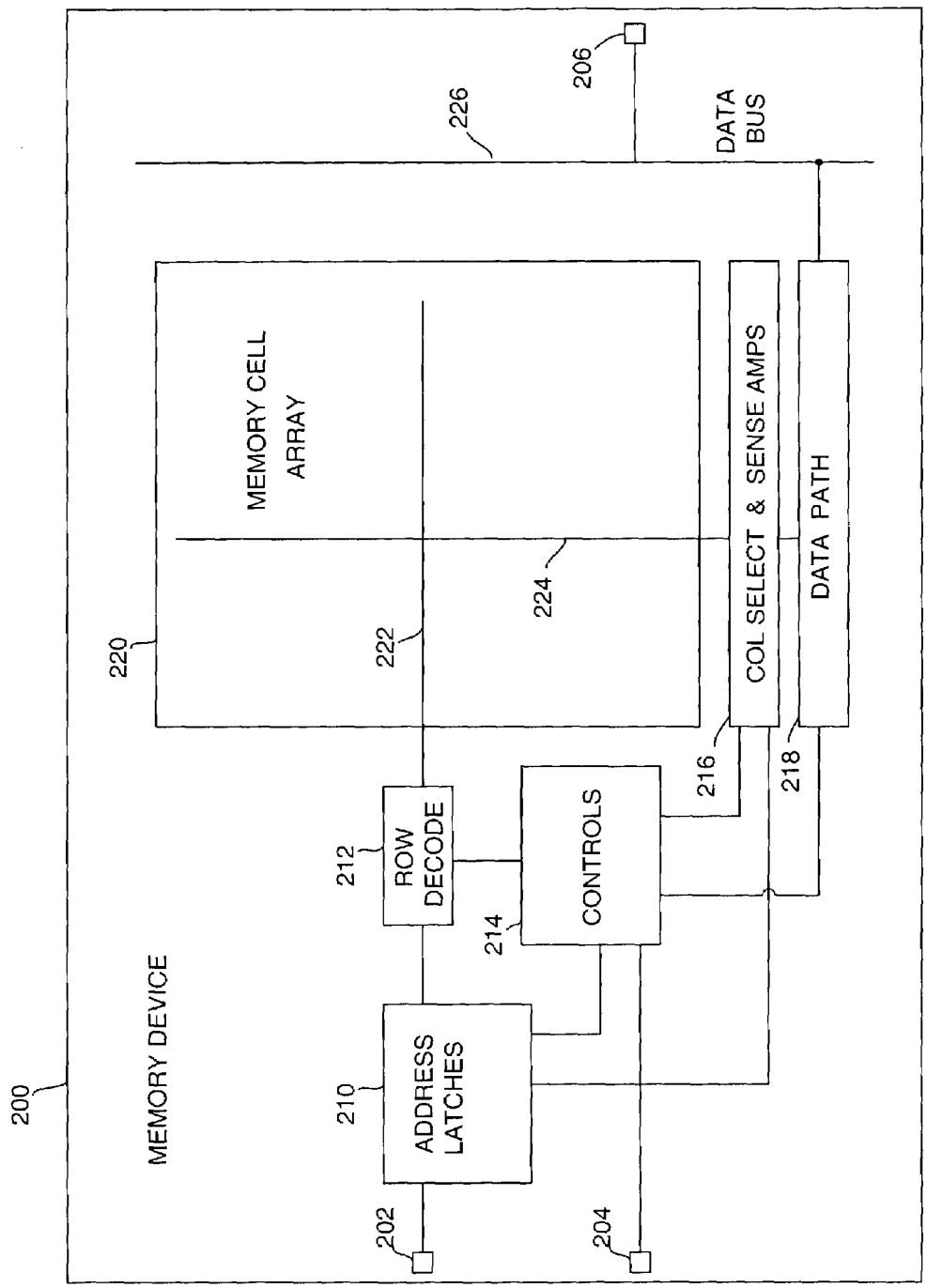
FIG. 2 shows an SDRAM memory containing data path circuit according to the current invention.

A memory device 200 as shown in FIG. 2 comprises at least one array of memory cells 220 for retaining data, with support circuitry for reading, writing, and testing. The memory has a write cycle for writing data from external signal ports 206 via data bus 226 to the memory array, and a read cycle for reading data from the array via data bus 226 to the external signal ports. Address latches 210 receive signals from address ports 202, comprising row address, column address, and command data. This information couples to row decoders 212, column select 216, and controls 214, respectively. The controls obtain a reference clock and control signals such as chip-select, read/write, and test from external ports 204, and commands from the address latches to operate row decoders 212, column select 216, and data path circuits 218. Row decoders 212 select a row 222 of memory cells for access, responsive to the row address and section signals from the controls. Column select/sense amplifier block 216 selects bitlines 224 for access, and performs read/write operations via the selected bitlines.

During a read cycle, each of the sense amplifiers typically produces a pair of complementary output signals responsive to the state of the memory cell coupled to the sense amplifier. A signal path conveys read-cycle signals from the sense amplifiers to a data bus and thence typically to external signal ports. The data bus typically uses a separate wire or node for conveying each individual signal. The signal ports comprise conventional buffer and protection circuits. In alternate implementations, the data bus may convey read-cycle signals to test evaluation circuits or to a packet controller.

During a write cycle, a data bus and appropriate data path circuitry convey data being written from external signal ports to the sense amplifiers, and thence to memory cells in an enabled row of the memory. The write data path comprises conventional logic, and will not be described further.

Figure 3:
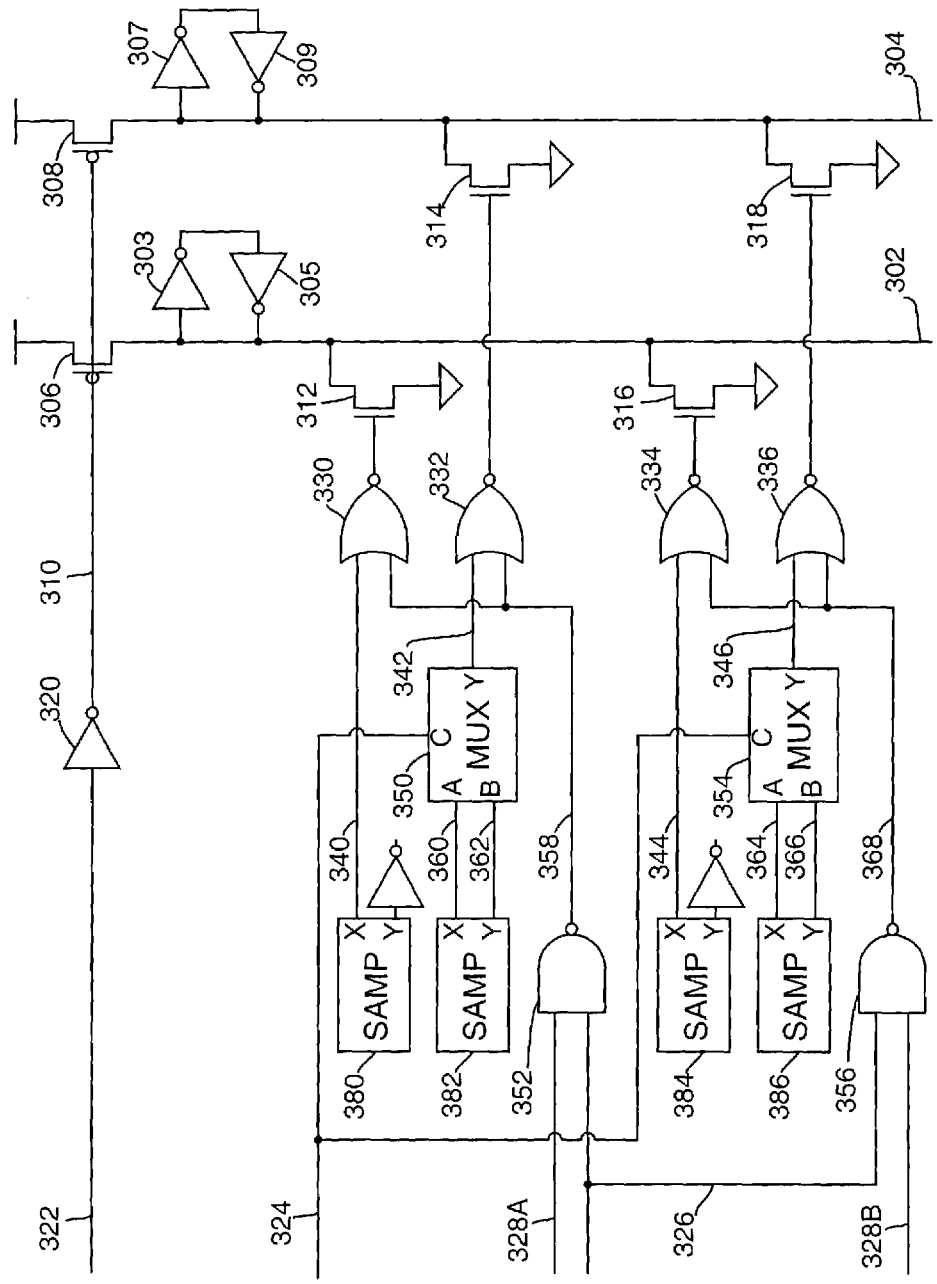
FIG. 3 shows a read data path circuit according to the preferred implementation of the current invention.

FIG. 3 shows a preferred embodiment of the current invention, comprising circuitry for conveying data values during a read cycle between the sense amplifiers and data wires that serve as both a read-data bus and a write-data bus.

FIG. 3 shows a pair of data bus nodes 302 and 304. Only one pair of data bus nodes appears in FIG. 3, but a memory device will normally contain a number of such pairs. The data bus nodes typically span a substantial fraction of the total length of the device.

Data bus nodes 302 and 304 connect to the drains of precharge transistors 306 and 308 respectively. The gates of precharge transistors 306 and 308 connect to node 310, and their sources connect to the positive supply voltage. Node 310 connects to the output of inverter 320. Input node 322 of inverter 320 is a precharge signal for the data bus lines. When node 322 is asserted high, the output of inverter 320 is driven low, activating the precharge transistors and coupling the data bus nodes 302, 304 logically high. When node 322 is low, node 310 is driven high by inverter 320, and the precharge transistors are cut off by the high level on node 310, decoupling the data bus nodes from the positive supply voltage.

A bus-latch, or bus-keeper circuit, comprises inverters 303 and 305 connected to data bus node 302. The bus-latch prevents node 302 from changing its logic state when the node is decoupled from both high and low logical values. Node 302 connects to the input of inverter 303. The output of inverter 303 connects to the input of inverter 305. The output of inverter 305 connects to node 302. When node 302 has been precharged high, the output of inverter 303 pulls the input of inverter 305 low, causing inverter 305 to hold node 302 high. Inverter 305 is typically strong enough only to hold the logic state of node 302 but not to switch this node. Inverter 305 can be easily overpowered by switching transistors 306, 312 or 316.

Inverters 307 and 309 perform the same bus-latch function for data bus node 304. Node 304 connects to the input of inverter 307. The output of inverter 307 connects to the input of inverter 309. The output of inverter 309 connects to node 304.

The data bus nodes also connect to switching transistors as follows. Node 302 connects to the drain contacts of switching transistors 312 and 316. Node 304 connects to the drain contacts of switching transistors 314 and 318. FIG. 3 shows two pairs of switching transistors, with transistors 312 and 314 comprising the first pair, and transistors 316 and 318 comprising the second pair. Many such pairs will typically connect to each pair of data bus nodes.

Source contacts of transistors 312, 314, 316, and 318 connect to the common supply voltage. The common supply can be at ground potential or another constant voltage that is sufficiently below the positive supply voltage for the devices to function according to this description.

The gate of switching transistor 312 connects to the output of NOR gate 330; the gate of switching transistor 314 connects to the output of NOR gate 332; the gate of switching transistor 316 connects to the output of NOR gate 334, and the gate of switching transistor 318 connects to the output of NOR gate 336. When any of these NOR gates has both its inputs logically low, the NOR gate drives its output high, activating the connected switching transistor and setting the data bus node connected to that transistor to a logic low state. When any of these NOR gates has either or both of its inputs high, the NOR gate drives its output logically low, cutting off the switching transistor connected to its output. When the switching transistor is cut off, it cannot switch its data bus node logically low.

One input of NOR gates 330 and 332 connects to node 358. One input of NOR gates 334 and 336 connects to node 368. Nodes 358 and 368 serve to enable and disable memory data transmission as follows. When logically high these nodes will, by their connection to inputs of the NOR gates, force the output of the attached NOR gate low, disabling memory data on the other input node of their respective NOR gates from activating the switching transistor connected to the output of that NOR gate. When low, nodes 358 and 368 enable signals on the other nodes 340, 342, 344, and 346 to determine whether the switching transistor driven by their respective NOR gates will be activated.

Node 358 connects to an output of NAND gate 352. One input of NAND gate 352 connects to read-enable node 326; the other input of NAND gate 352 connects to section-enable node 328A. Node 368 connects to the output of NAND gate 356. One input of NAND gate 356 connects to read-enable node 326; the other input of NAND gate 356 connects to a separate section-enable node 328B.

The other input of NOR gate 330 connects to node 340. Node 340 connects to a non-inverting output X of sense amplifier 380.

The other input of NOR gate 332 connects to node 342. Node 342 connects to an output Y of multiplexer 350.

Both multiplexers in FIG. 3 function as follows. Each has an output Y, data inputs A and B, and a control input C. The multiplexer couples its output Y to its input A when its control input C is logically low, and couples its output Y to its input B when its control input C is logically high.

Multiplexer 350 has its A input connected to node 360, its B input connected to node 362, and its C input connected to node 324. So when node 324 is logically low, node 342 couples to node 360 by multiplexer 350. When node 324 is logically high, multiplexer 350 couples node 342 to node 362. Thus multiplexer 350 effectively switches an input of NOR gate 332 between nodes 360 and 362 depending on the state of node 324. The signal on node 324 is a compression test mode enable signal that switches the device into compression test mode when asserted logically high, and into normal mode when logically low. Nodes 360 and 362 connect respectively to the non-inverting X, and inverting Y, outputs of sense amplifier 382. Multiplexer 350 thus serves to switch the second input of NOR gate 332 between the non-inverting output of sense amplifier 382 in regular operation, and the inverting output of this same amplifier in compression test mode.

The other input of NOR gate 334 connects to node 344, which further connects to a non-inverting output X of sense amplifier 384.

The other input of NOR gate 336 connects to node 346, which further connects to an output Y of multiplexer 354.

Control signal C of multiplexer 354 connects to compression test mode enable node 324. Input A of multiplexer 354 connects to node 364, and input B connects to node 366. Node 364 connects to a non-inverting output X of sense amplifier 386; node 366 connects to an inverting output Y of sense amplifier 386. Multiplexer 354 therefore switches the other input of NOR gate 336 between a non-inverting output of sense amplifier 386 in regular operation when node 324 is logically low, and the inverting output of this same sense amplifier 386 during compression test mode read cycles, when node 324 is logically high.

In normal operating mode, section-enable nodes 328A and 328B remove contention between the upper pair of sense amplifiers 380, 382 and the lower pair of sense amplifiers 384, 386 on the data bus nodes. Normal mode never sets section-enable nodes 328A and 328B logically high together in the same read cycle, thus allowing only one pair of sense amplifiers to drive each pair of data bus nodes during a read cycle.

In compression test mode, a plurality of the section-enable nodes 328A, 328B, . . . , may be set high simultaneously during a read cycle, permitting simultaneous testing of multiple pairs of data signals from multiple pairs of sense amplifiers coupled to each pair of data bus nodes, shown in FIG. 3, as follows.

Four sense amplifiers are shown in two pairs. Sense amplifiers 380 and 382 comprise the first pair, and sense amplifiers 384 and 386 comprise a second pair. Each sense amplifiers outputs signals representing the data held by one memory cell within the memory.

Sense amplifiers 380, 382, 384, and 386, during a memory read cycle, each output a complementary pair of signals on respective ports X and Y reflecting the state of the memory bit being read by that sense amplifier. Typically when the data bit being read by a sense amplifier contains a one, a logic high will be driven out its X port and a logic low will be driven out its Y port. When the data bit being read by a sense amplifier contains a zero, a logic low will be driven out its X port and a logic high will be driven out its Y port. The Y output of sense amplifiers 380 and 384 each connect to the input of a separate inverter to balance the output loads.

Read-enable node 326 is asserted logically high during a read cycle and logically low otherwise. The signal on this node enables the signals on the sense amplifier output nodes X and Y to couple to the data bus nodes 302, 304 when node 326 is logically high, provided a section node 328 is also logically high.

During a write cycle, read-enable node 326 is logically low, decoupling all sense amplifier outputs from the data bus nodes.

According to the current invention the transmission of memory data from the sense amplifiers to the data bus nodes during a read cycle requires five steps: first, precharging the data bus nodes logically high; second, decoupling the data bus nodes from the logical high signal; third, retaining the logical high signal on each data bus node via a weak bus-latch; fourth, enabling appropriate signal paths according to the operating mode; and fifth, selectively coupling the data bus nodes logically low responsive to the data in the memory cells being read by the sense amplifiers. The information transmitted comprises either compression test mode data or normal operation mode data.

In normal operating mode, valid data from each pair of sense amplifiers appears on the pair of data bus nodes, depending on which of the section-enable lines 328A or 328B (but not both) is asserted high.

In compression test read mode, with nodes 324, 328A, and 328B asserted high, and with all zeroes or all ones having been written to the memory, valid operation of the device produces complementary signals on each pair of data bus nodes. An error has occurred when both nodes of a pair have the same value, either both high or both low.

For example, when all ones have been written to the memory for testing, the output of sense amplifiers 380–386 all should have X=1 and Y=0. When compression test mode signal 324 is asserted high for compression test mode operation, and read-enable 326 is asserted high to read the memory, and section-signals 328A, 328B are both asserted high to read both pairs of sense amplifiers simultaneously, nodes 358 and 368 will both be driven low by NAND gates 352 and 356, enabling both pairs of sense amplifier signals to couple to the data bus nodes. The logic high X=1 from sense amplifiers 380 and 384 should be applied to NOR gates 330 and 334 respectively, setting the outputs from these NOR gates logically low and cutting off transistors 312 and 316, leaving data bus node 302 in its logical high state. The logic low from output Y of sense amplifiers 382 and 386 should be connected to inputs of NOR gates 332 and 336 respectively, via multiplexers 350 and 354. Because all inputs of NOR gates 332 and 336 should be low, their outputs should be driven high, turning on transistors 314 and 318, pulling data bus node 304 logically low. This example therefore should produce different signals on the data bus nodes: a high on 302 and a low on 304, indicating valid data have been read in compression test mode.

An error in the cells being read produces a different pattern on the data bus nodes and thus be detected. Assuming all ones have been written to the memory, if either sense amplifier 380 or 384 has its non-inverting output X erroneously low, then line 302 will also be driven low, indicating the error. Conversely, if all zeroes have been written to the memory, the inverting output Y of each sense amplifier should be high during a compression test mode read cycle. If the inverting output of sense amplifiers 382 or 386 is erroneously low at this time, the data bus node 304 will be driven low, indicating the error.

A normal mode read for the example above sets compression test mode signal 324 logically low and performs the read with only one section-enable signal, say 328A, asserted high; the other section-enable signal 328B is set low to avoid contention on the data bus nodes 302, 304 during normal mode operation. In this case the X outputs of sense amplifiers 380, 382 connect to NOR gate inputs 340, 342 respectively. Because both these X outputs are high when ones have been written to the memory and the device is operating properly, both NOR gates 340 and 342 have their outputs held low; neither of transistors 312 and 314 is activated and the data bus nodes both stay high during the read cycle just described.

An arbitrary number of sense amplifier pairs may connect in this manner to the data bus nodes, without increasing the wiring complexity of the circuit. The data bus nodes simply grow in length, and additional pairs connect below those shown in FIG. 3. Each additional pair has its own section-enable signal 328, connected as shown. Normal mode avoids contention and ambiguity by enabling one pair at a time. Compression test mode can compress signals by enabling the pairs of sense amplifiers simultaneously. If any of the enabled pairs generates a fail condition then the data bus indicates a failure in the enabled pairs. In compression test mode, enabling more sections in one read cycle increases the amount of data being compressed with two data bits being compressed per section enabled. In the current invention; there is no limit to the number of sections which may be so compressed. Enabling additional sections in compression test mode does not increase the data line loading, add extra wires, or slow down the read cycle. Thus this design has the advantage that it may be scaled up very easily to compress more data per cycle, overcoming limitations of prior art.

Figure 4:
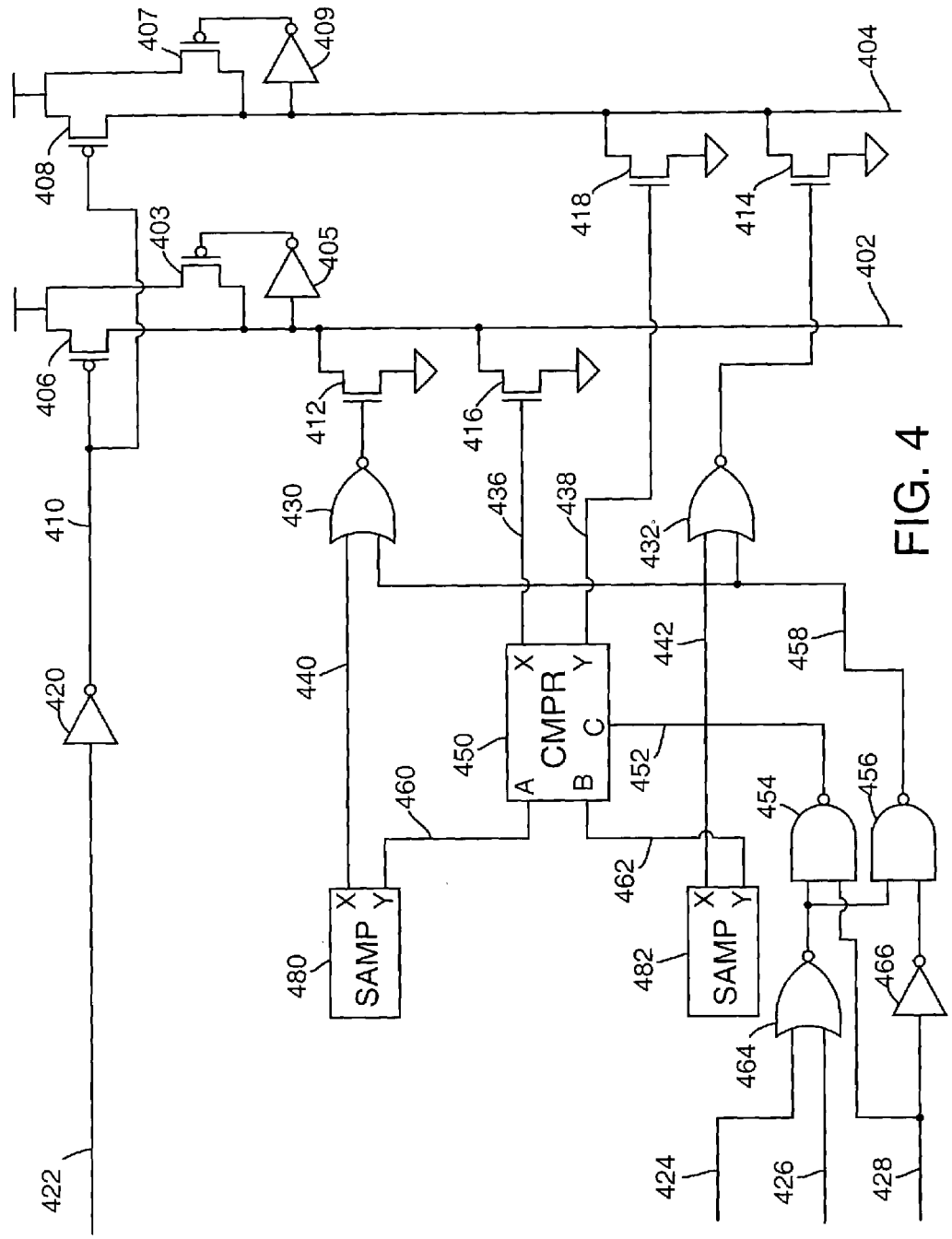
FIG. 4 shows a read-data design according to an alternate implementation of the current invention.

FIG. 4 shows an alternate embodiment of the current invention. In FIG. 4, data bus node 402 connects to the drains of transistors 406, 403, 412, and 416. The gate of transistor 406 connects to node 410, and the source of transistor 406 connects logically high. The source contacts of transistors 403 and 407 connect logically high. The gate of transistor 403 connects to the output of inverter 405; the input of inverter 405 connects to node 402, forming a loop which latches a logic high state on node 402. The gate of transistor 412 connects to the output of NOR gate 430. The source of transistor 412 connects logically low. The gate of transistor 416 connects to node 436. The source of transistor 416 connects logically low.

Data bus node 404 connects to the drain contact of transistors 408, 407, 414, and 418. The gate of transistor 408 connects to node 410. The source of transistor 408 connects logically high. The gate of transistor 407 connects to the output of inverter 409. The input of inverter 409 connects to node 404, forming a loop which latches a logic high state on node 404. The gate of transistor 414 connects to the output of NOR gate 432. The source of transistor 414 connects logically low. The gate of transistor 418 connects to node 438. The source of transistor 418 connects logically low. The output of inverter 420 connects to node 410 and the input of inverter 420 connects to precharge node 422.

A first input of NOR gate 430 connects to node 440 and a second input of this NOR gate connects to node 458. A first input of NOR gate 432 connects to node 442 and a second input connects to node 458. Node 440 connects to a non-inverting output X of sense amplifier 480. Node 442 connects to a non-inverting output X of sense amplifier 482. Node 458 connects to the output of NAND gate 456. NAND gate 456 has a first input connected to the output of NOR gate 464, and a second input connected to the output of inverter 466. A first input of NOR gate 464 connects to read enable node 424, and a second input connects to section enable 426. The input of inverter 466 connects to test-enable node 428.

Node 436 connects to a first output X of compression circuit 450; node 438 connects to a second output Y of compression circuit 450. A first data input A of compression circuit 450 connects to node 460, which further connects to an inverting output Y of sense amplifier 480. A second data input B of compression circuit 450 connects to node 462, which further connects to an inverting output Y of sense amplifier 482. Control input C of compression circuit 450 connects to node 452, which further connects to the output of NAND gate 454. A first input of NAND gate 454 connects to the output of NOR gate 464 and a second input connects to compression-enable node 428.

FIG. 4 shows only one pair of sense amplifiers for brevity, but a plurality of sense amplifier pairs with identical coupling logic typically connect to data bus nodes 402 and 404. An advantage of the FIG. 4 design is that it may be scaled up very simply to include additional sense amplifier pairs, wired as shown, with section enable node 426 controlled separately in each memory section.

In FIG. 4, transistors 406 and 408 precharge data bus nodes 402 and 404 high when node 410 goes low at the outset of a normal mode read cycle and of a compression test mode read cycle. When the precharge is completed, node 422 drives low, sending gate node 410 high via inverter 420 to cut off the active precharge. Weak bus-latch transistors 403 and 407 hold nodes 402 and 404 high, respectively. In FIG. 4, the bus-latching mechanism provided by devices 403, 405, 407, and 409 is an alternate acceptable half-latch instead of the full bus-latch shown in FIG. 3.

The circuit of FIG. 4 transfers data from sense amplifiers 480 and 482 to data bus nodes 402 and 404 by first precharging the data bus nodes logically high, then decoupling these nodes from the logical high signal and weakly latching them high, then selectively setting these nodes logically low responsive to the data held by the sense amplifiers.

In FIG. 4 during normal mode read operation, after removing active precharge, read-enable node 424 is set low to enable reading, section-enable node 426 is set low to enable the section associated with sense amplifiers 480 and 482, and node 428 is set low to activate normal mode. The low values on nodes 424 and 426 set the output of gate 464 high, and the low on node 428 disables compression and enables the normal-mode read channel by setting node 458 low and node 452 high via NAND gates 454 and 456. When node 452 is high, compression circuit outputs 436 and 438 will remain low as described in more detail below, cutting off transistors 416 and 418, effectively disabling the compression test mode signal path. In normal operation, switching transistors 412 and 414 selectively connect nodes 402 and 404 low, respectively, as follows, responsive to data values on the non-inverting X output nodes of sense amplifiers 480 and 482. When nodes 440 and 458 are low, NOR gate 430 activates transistor 412, driving data bus node 402 low. When node 440 is high, the output of NOR gate 430 is low, transistor 412 is cut off, and data bus node 402 retains its precharged high state. When node 442 is high, the output of NOR gate 432 is low, cutting off transistor 414 so that data bus node 404 retains its precharged high state. Thus in normal mode read cycle, logic values on nodes 440 and 442 are driven onto data bus nodes 402 and 404 respectively.

In FIG. 4 during compression test mode, node 424 is set low to enable reading, node 426 is set low to enable the section containing sense amplifiers 480 and 482, and node 428 is set high to enable compression test mode by driving node 452 low and node 458 high, via nand gates 454 and 456. When enable-node 458 is high transistors 412 and 414 will be cut off, disabling the normal mode read channel. Transistors 416 and 418 selectively connect data bus nodes 402 and 404 low during compression test mode, responsive to data held on inverting outputs 460 and 462 of each sense amplifier and compression circuit 450. When outputs 436 and/or 438 from the compression circuit are high, they activate the respective gates of transistors 416 and 418 to set data bus nodes 402 and/or 404 respectively low.

Since many pairs of sense amplifiers are typically connected to the data bus nodes as shown, compression testing mode may enable multiple pairs to compress their data together and speed up device testing. In the current invention, compression testing mode has the advantage of simultaneously testing many such pairs without limit, and with no loss of speed in the read cycle, simply by enabling many sections for compression in the same read cycle.

Figure 5:
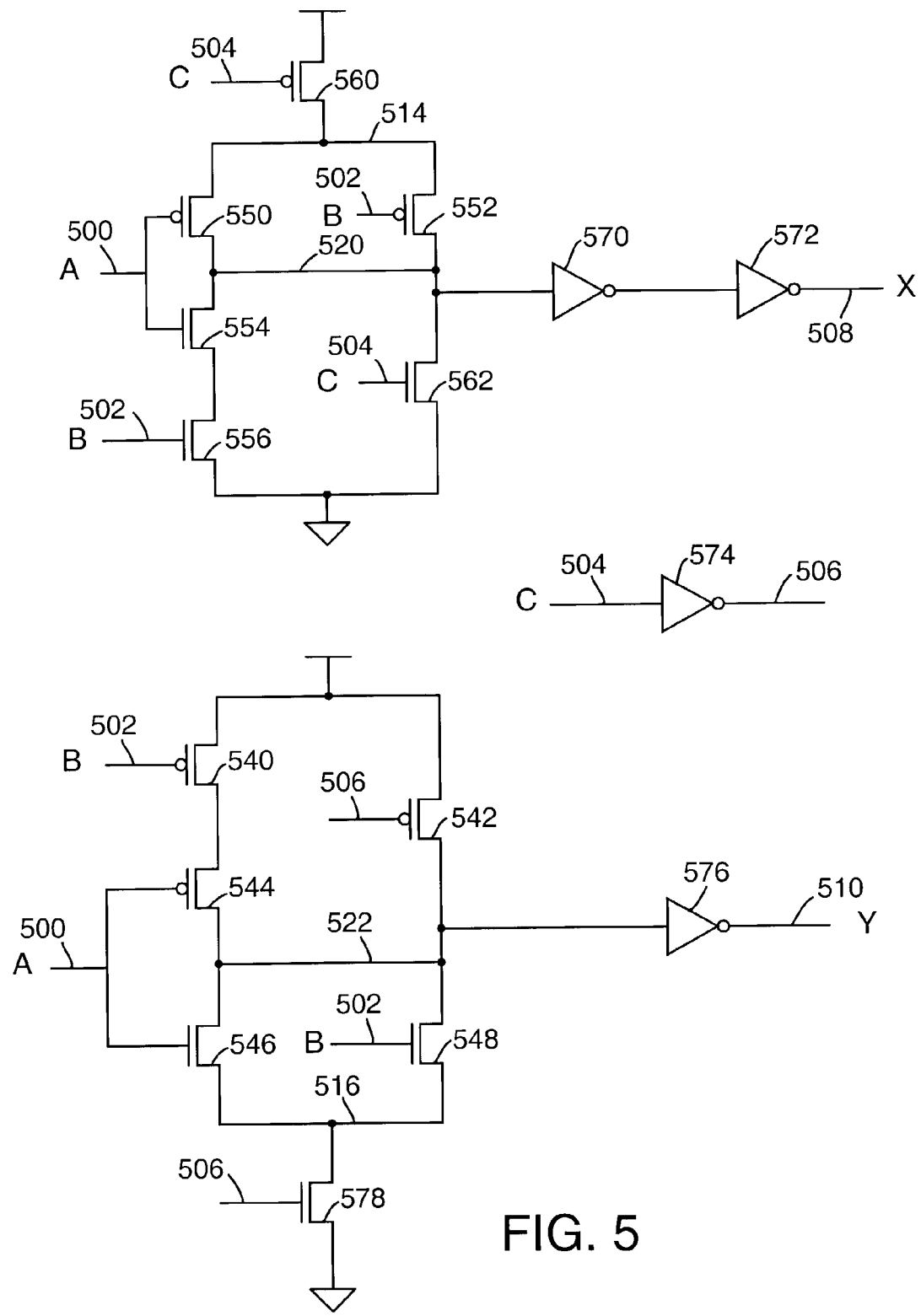
FIG. 5 details the compression circuit of FIG. 4.

FIG. 5 details the compression circuit 450 of FIG. 4, comprising data inputs 500 and 502, a control input 504, and logic outputs 508 and 510. These nodes correspond respectively to labels A, B, C, X, and Y in both FIG. 4 and FIG. 5.

Logic output 508 connects to the output of inverter 572. The input of inverter 572 connects to the output of inverter 570. The input of inverter 570 connects to node 520. Node 520 connects to the drains of transistors 550, 552, 554, and 562. The source of transistor 550 connects to node 514. The gate of transistor 550 connects to input node 500. The source of transistor 552 connects to node 514. The gate of transistor 552 connects to input node 502. The drain of transistor 560 connects to node 514. The gate of transistor 560 connects to control input node 504. The source of transistor 560 connects logically high. The gate of transistor 554 connects to input node 500. The source of transistor 554 connects to the drain of transistor 556. The gate of transistor 556 connects to input node 502. The source of transistor 556 connects logically low. The gate of transistor 562 connects to control input 504. The source of transistor 562 connects logically low.

Logic output 510 connects to the output of inverter 576. The input of inverter 576 connects to node 522. Node 522 connects to the drains of transistors 542, 544, 546, and 548. The gate of transistor 542 connects to node 506. The source of transistor 542 connects logically high. Node 506 connects to the output of inverter 574. The input of inverter 574 connects to control input 504. The gate of transistor 544 connects to data input node 500. The source of transistor 544 connects to the drain of transistor 540. The gate of transistor 540 connects to data input node 502. The source of transistor 540 connects logically high. The gate of transistor 546 connects to data input node 500. The source of transistor 546 connects to node 516. The gate of transistor 548 connects to data input node 502. The source of transistor 548 connects to node 516. Node 516 connects to the drain of transistor 578. The gate of transistor 578 connects to node 506. The source of transistor 578 connects logically low.

When control input 504 is high, it activates transistor 562 and cuts off transistor 560, effectively coupling node 520 low and thus setting node 508 low via inverters 570 and 572. Also when control input 504 is high, inverter 574 drives node 506 low. When node 506 is low, it activates transistor 542 and cuts off transistor 578, effectively coupling node 522 high and driving node 510 low via inverter 576. When control input 504 is high, therefore, outputs 508 and 510 are both held low, and cut off transistors 416 and 418 in FIG. 4, disabling the compression data path.

When control input 504 is low, it activates transistor 560 and cuts off transistor 562, thus enabling transistors 550–556 to drive node 520 with a logical NAND of data inputs 500 and 502. Inverters 570 and 572 then drive node 508 identically with node 520, to output a logical nand of data inputs 500 and 502. Also when control input 504 is low, node 506 will be driven high by inverter 574, cutting off transistor 542 and activating transistor 578, thus enabling transistors 540, 544, 546, and 548 to drive node 522 with a logical NOR of inputs 500 and 502. Inverter 576 then drives node 510 with the logical OR of inputs 500 and 502.

To describe test-pass operation of FIG. 4, assume that zeroes have been written to the memory cells coupled to sense amplifiers 480 and 482. During a compression test mode read cycle, if operating correctly, the inverting Y outputs of these amplifiers connect nodes 460 and 462 both high. In this condition input nodes 500 and 502 of FIG. 5 are both high, while input 504 is low to enable compression test mode operation. These conditions will cause the circuit of FIG. 5 to connect internal node 520 and thus output 508 low. The high on node 500 also connects internal node 522 low in compression test mode, which drives output 510 high through inverter 576. So this condition leads to complementary outputs, a low on 508 and a high on 510. In FIG. 4, this drives node 436 low and node 438 high, activating transistor

418 to switch node 404 low, and cutting off transistor 416 to leave node 402 in its precharged or logically high state. Thus in test-pass, complementary signals appear on read-write data nodes 402 and 404.

To describe the test-fail operation of FIG. 4, assume that zeroes have been written to the memory cells connected to sense amplifiers 480 and 482. Assume further that during compression test mode read cycle, sense amplifier 480 incorrectly transmits a logically low level to node 460 while sense amplifier 482 correctly transmits a logically high level to node 462. In this condition the FIG. 5 circuit sets input node 500 low and input node 502 high, while input 504 is low to enable compression test mode operation. The FIG. 5 circuit thus connects internal node 520 and output node 508 high, while also pulling internal node 522 low, via transistor 548, which drives output 510 high. So in FIG. 4 in this case, nodes 436 and 438 both go high, activating transistors 416 and 418 respectively, and pulling data bus nodes 402 and 404 simultaneously low to indicate a test failure in the current cycle.

Features of the current invention, and the problems solved by these features, include:
  (a) A design having single data bus for both reading and writing the memory in normal mode and compressed test mode, reducing the size of the device by eliminating data bus wires required in prior art,
  (b) A design which adds read-cycle compression test mode to read-cycle normal operating mode by using the same devices for switching the data bus nodes and adding no extra device loading to the data bus wires for compression test mode, thus providing the same speed of operation of operation in both modes, and avoiding a p-type device in every compression data bus driver and slower operation of compression test mode in prior art designs,
  (c) A design which adds read-cycle compression test mode to read-cycle normal operating mode while providing a significant reduction in number of transistors and wires required in prior art, enabling smaller device sizes compared to prior art,
  (d) An easily scalable architecture of compression and data bus wiring, in which more memory cells may be added to the compression data by simply extending the data bus lines, connecting more identical sections, and enabling the additional sections,
  (e) A compression architecture imposing no upper bound on the number of memory cells which may be simultaneously tested in compression test mode: when more sections are enabled, then more sense amplifier outputs are compressed together during each access, and
  (f) A design that can balance the true and complement loads of the sense amplifier so that no dummy loads are needed.

Though the above description discloses many details, these details should not be understood to limit the current invention. Obvious variations such as a minor change in logic design, addition of passive devices, or a modified scheme for encoding valid and failing test data, while making use of the structures, functions, or methods of the current invention, would fall within the scope of the patent rights claimed by the inventor. Therefore the scope of the invention should be limited only by the appended claims and their legal equivalents.

I claim:

1. A memory device comprising:
  (a) a plurality of data ports for conveying a plurality of address signals, a plurality of data signals, and a plurality of control signals between the device and a plurality of circuits external to the device,
  (b) a plurality of address latches for receiving and storing the address signals from the data ports,
  (c) a memory cell array comprising a plurality of memory cells disposed in a plurality of rows and a plurality of columns, for retaining a plurality of data values and a plurality of test data values,
  (d) a plurality of row decoders for enabling access to the rows of the array for reading and writing,
  (e) a plurality of column decoders for enabling access to the columns of the array for reading and writing,
  (f) a plurality of sense amplifiers for sensing and amplifying a plurality of signals representing the data values and the test data values, each sense amplifier having at least one output node for conveying the data signals and the test data signals during a read cycle, each sense amplifier having at least one input node for receiving the data signals and the test data signals during a write cycle,
  (g) a control circuit for coordinating the operation of the address latches, the row decoders, the column decoders, the sense amplifiers, and a plurality of data path logic circuits, the control circuit defining a write cycle in a normal operating mode for writing the data values to the memory device, the control circuit defining a read cycle in the normal operating mode for reading the data values from the memory device, the control circuit defining a write cycle in a compression test mode for writing the test data values to the memory device, the control circuits defining a read cycle in the compression test mode for reading a compressed representation of the test data values from the memory device,
  (h) the data path logic circuits, for conveying a plurality of read cycle signals representing the data values during the read cycle in the normal operating mode and the compressed representation of the test data values during the read cycle in the compression test mode, from the output nodes of the sense amplifiers to a plurality of data bus nodes, and for conveying the data values during the write cycle in the normal operating mode and the test data values in the compression test mode from the data bus nodes to the sense amplifier input nodes, the data path logic circuits being disposed substantially adjacent to the sense amplifiers,
  (i) the data bus nodes, being the outputs of the data path logic circuits in the normal mode read cycle and in the compression test mode read cycle, and being the inputs of the data path logic circuits in the normal mode write cycle and in the compression test mode write cycle,
  the data path logic circuits having means including a separately enabled signal path for each of the operating modes, for coupling the output node of each of the sense amplifiers to a separate one of the data bus nodes during the read cycle in the normal operating mode and to the same one of the data bus nodes during the read cycle in the compression test mode, and for coupling the input node of each of the sense amplifiers during the write cycle in the normal operating mode and during the write cycle in the compression test mode, to the same one of the data bus nodes as couples to the output node of the same sense amplifier during the read cycle.

2. The memory device of claim 1, in which:
  the data path logic circuits have means including a plurality of switching devices coupled to each of the data bus nodes for switching the logical values on the data bus node during a read cycle, each of the switching devices adding a capacitive load of the switching device to the data bus node, the node switching devices utilized during the read cycle in the normal operating mode and during the read cycle in the compression test mode being the same, thereby implementing the compression test mode read cycle with no more of the device capacitive loads on each of the data bus nodes than is required for implementing the normal mode read cycle alone.

3. A logic design for conveying a plurality of logic signals from a plurality of sense amplifiers to a plurality of data bus nodes, each of the sense amplifiers having at least one output node for conveying a logic signal, comprising:

(a) a plurality of pairs of the data bus nodes, each of the pairs of data bus nodes comprising a first data bus node and a second data bus node;

(b) for each of the data bus nodes, means including at least one precharge device, for coupling the data bus node to a logically high signal responsive to assertion of a precharge signal, and for decoupling the data bus node from the logically high signal when the precharge signal is negated;

(c) for each of the data bus nodes, means including a bus-latch for preventing a logic signal on the data bus node from changing to a different logical value when the data bus node is decoupled from all active logic signals;

(d) for each of the pairs of data bus nodes, means including a plurality of pairs of switching devices for selectively coupling the data bus nodes to a logical low signal, each of the pairs of switching devices being associated with exactly one of the pairs of data bus nodes, each of the pairs of switching devices comprising a first switching device connected between the first data bus node and the logical low signal and a second switching device connected between the second data bus node and the logical low signal, each of the switching devices having a control node for activating and deactivating the switching device, each of the switching devices setting its data bus node logically low when activated responsive to a first logical signal value on the switching device control node, each of the switching devices decoupling its data bus node from the logical low signal when deactivated responsive to a second logical signal value on the switching device control node;

(e) for each of the pairs of switching devices, means including a plurality of logic gates for activating and deactivating the switching devices, comprising a first logic gate having an output node connected to the control node of the first switching device, and a second logic gate having an output node connected to the control node of the second switching device, the first logic gate having a first input connected to a first internal data node and a second input connected to an enable node, the second logic gate having a first input connected to a second internal data node and a second input connected to the enable node;

(f) for each of the pairs of switching devices, means including a first one of the sense amplifiers for setting a first logic signal on the first internal data node, the output node of the first sense amplifier coupling to the first internal data node, and means including a second one of the sense amplifiers and a multiplexer, for setting a second logic signal on the second internal data node in normal operating mode, and for setting an inverse of the second logic signal on the second internal data node in compression test mode;

the multiplexer comprising an output node, a first data input node, a second data input node, and a control input node, the multiplexer coupling its output node to its first data input node responsive to a first logical value on its control input node, the multiplexer coupling its output node to its second data input node responsive to a second logical value on its control input node;

the output of the multiplexer coupling to the second internal data node, the control input node of the multiplexer coupling to a compression test mode enable signal, the first data input node of the multiplexer coupling to the output node of the second sense amplifier, and the second data input node of the multiplexer coupling to a signal which is the complement of the logic signal value on the output node of the second sense amplifier.

4. The logic design of claim 3, implemented in a complementary metal oxide semiconductor process technology, providing a semiconductor circuit design in which the data bus nodes are typically implemented in at least one electrically conductive layer, the precharge devices are p-type transistors, the switching devices are n-type transistors, both of the logic gates are nor-gates, and the sense amplifiers, multiplexers, and bus-latches are conventional devices known in the process technology.

5. In a memory device having a normal operating mode for writing, retaining, and reading a plurality of logic data values, and a compression test mode for writing, retaining, and reading a plurality of test logic data values and for determining valid and erroneous operation, the memory device having a write cycle in the normal operating mode for writing the logic data values and in the compression test mode for writing the test logic data values to the memory device, the memory device having a read cycle in the normal operating mode for conveying the logic data values from the memory device, the memory device having a read cycle in the compression test mode for conveying a compressed representation of the test data values from the memory device, the memory device having a write/read cycle in the compression test mode for writing and reading a plurality of the test data values in a single access; the memory device being partitioned into a plurality of sections, each section comprising a plurality of rows, each row comprising a plurality of memory cells, each of the memory cells capable of storing one of the logic data values in the normal operating mode and one of the test logic data values in the compression test mode, each of the sections capable of being individually enabled for access during the normal operating mode read cycle, a plurality of the sections capable of being simultaneously enabled for access during the compression test mode read cycle, the memory device having a plurality of sense amplifiers for sensing and conveying the logic data values and the test logic data values during the read and write cycles, each of the sense amplifiers having at least one data output node for conveying a memory data signal, the memory data signal on the data output node of each sense amplifier being responsive in the normal operating mode to the logic data value stored in a selected memory cell to which the sense amplifier is coupled and in the compression test mode to the test logic data value stored in the selected memory cell to which the sense amplifier is coupled, the memory device having a plurality of data bus nodes comprising a portion of a signal path for coupling the logic data values and the test logic data values being written during a write cycle from a plurality of external signal ports to the sense amplifiers, for coupling the logic data values from the sense amplifiers to the external signal ports during the normal mode read cycle, and for coupling a compressed representation of the test logic data values from the sense amplifiers to the external signal ports during the compression test mode read cycle, the data bus nodes being grouped into a plurality of pairs of data bus nodes;

during the read cycle in the normal operating mode each of the pairs of data bus nodes coupling to a pair of the sense amplifiers in the one section that may be enabled for access, the data output node of a first sense amplifier in the pair of sense amplifiers coupling to a first data bus node in the pair of data bus nodes, and the data output node of a second sense amplifier in the pair of sense amplifiers coupling to a second data bus node in the pair of data bus nodes;

during the read cycle in compression test mode each of the pairs of data bus nodes coupling to at least one pair of sense amplifiers in each of the plurality of sections which may be enabled for access;

an arrangement of a plurality of active logic devices and a plurality of logic signal interconnections with means including multiplexers, logic gates, and switching devices for conveying, during a read cycle, the logic data values in the normal operating mode and a compressed representation of the test logic data values in the compression test mode from the sense amplifiers to the data bus nodes, the arrangement being disposed substantially adjacent to the sense amplifiers, the arrangement placing no fixed upper bound on the number of the memory cells which may be read a single read cycle in the compression mode and requiring no additional data bus nodes.

6. In the memory device of claim 5: an arrangement of a plurality of active logic devices and a plurality of logic signal interconnections for conveying, during the read cycle, the logic data values in the normal operating mode and a compressed representation of the test logic data values in the compression test mode from the sense amplifiers to the data bus nodes, the arrangement having means including switching devices which may operate in parallel, for completing the read cycle in the compression test mode as rapidly as, or more rapidly than, the read cycle in the normal operating mode.

7. The memory device of claim 5, in which each one of the pairs of data bus nodes comprises a first data bus node and a second data bus node, and each one of the pairs of sense amplifiers comprises a first sense amplifier associated with the first data bus node and a second sense amplifier associated with the second data bus node:

an arrangement of a plurality of active logic devices and a plurality of logic signal interconnections for conveying, during a read cycle, data values in the normal operating mode and a compressed representation of the data values in the compression test mode, from the sense amplifiers to the data bus nodes, the arrangement in the read cycle in the compression test mode having means including multiplexers, logic gates, and switching devices for compressing a plurality of the data values from the data output nodes of the sense amplifiers in the simultaneously enabled sections onto their associated data bus node by means of a logic or-function.

8. The memory device of claim 5, in which each one of the pairs of data bus nodes comprises a first data bus node and a second data bus node, and each one of the pairs of sense amplifiers comprises a first sense amplifier associated with the first data bus node and a second sense amplifier associated with the second data bus node:

an arrangement of a plurality of logic devices and a plurality of logic signal interconnections for conveying, during a read cycle, data values in the normal operating mode and a compressed representation of the data values in the compression test mode, from the sense amplifiers to the data bus nodes, the arrangement in the read cycle in the compression test mode having means including multiplexers, logic gates, and switching devices for compressing a plurality of the data values from the data output nodes of the sense amplifiers in the simultaneously enabled sections onto their associated data node by means of a negative-logic or-function.

9. The arrangement of claim 5, the arrangement during the read cycle in the compression test mode requiring only the two data bus nodes in a particular pair of data bus nodes for conveying a compressed representation of the test data values of all the sense amplifiers being compressed.

10. The arrangement of claim 5, the memory device requiring no additional types of control circuits as the number of enabled memory sections is increased in compression test mode.

11. The arrangement of claim 5, the memory device requiring no new data path signals as the number of enabled memory sections is increased in compression test mode.

12. Within a memory device having a normal operating mode for writing, retaining, and reading a plurality of logic data values, and a test operating mode for determining valid and erroneous operation, the memory device having a write cycle in both the normal operating mode and the test operating mode for writing a plurality of data values to the memory device, the memory device having a read cycle in the normal operating mode for reading the data values from the memory device, the memory device having a read cycle in the test operating mode for conveying a compressed representation of the data values from the memory device, the memory device having a plurality of memory cells for storing the data values and a plurality of sense amplifiers for sensing and conveying the data values stored in the memory cells, each of the sense amplifiers having at least one data output node for conveying a memory data signal, the memory data signal on the data output node of each sense amplifier being responsive to the data value stored in a selected memory cell to which the sense amplifier is coupled during the read cycle in each of the modes, the memory device being partitioned into a plurality of sections, each section comprising a plurality of rows, each row comprising a plurality of memory cells, each of the memory cells capable of storing one of the data values, each of the sections capable of being separately enabled for access during the read cycle in the normal operating mode by assertion of a separate section enable signal for each one of the sections, a plurality of the sections capable of being simultaneously enabled for access during the read cycle in the compression test mode of operation by simultaneous assertion of their section enable signals, the memory device having a plurality of data bus nodes, each data bus node connecting to active logic devices disposed substantially adjacent to the sense amplifiers:

an arrangement of a plurality of active logic devices and a plurality of logic signal interconnections for conveying the memory data signals during the read cycle in the normal operating mode from the sense amplifiers to the data bus nodes, and for conveying a compressed representation of the memory data signals during the read cycle in the test operating mode from the sense amplifiers to the data bus nodes, the arrangement comprising:

(a) a plurality of pairs of the data bus nodes, each of the pairs of data bus nodes comprising a first data bus node and a second data bus node;

(b) means including a plurality of precharge devices, at least one of the precharge devices coupling to each data bus node, for coupling the data bus nodes to a logical high signal upon assertion of a precharge signal, and for decoupling the data bus nodes from the logical high signal upon negation of the precharge signal;

(c) means including at least one bus-latch connected to each individual data bus node for preventing a logic signal on the data bus node from changing its logic value when the data bus node is not actively coupled to a specific logic value;

(d) for each of the pairs of data bus nodes, means including a plurality of pairs of switching devices for selectively coupling the data bus nodes to a logical low signal, each of the pairs of switching devices being associated with exactly one of the pairs of data bus nodes, each of the pairs of switching devices comprising a first switching device connected between the first data bus node and the logical low signal and a second switching device connected between the second data bus node and the logical low signal, each of the switching devices having a control node for activating and deactivating the switching device, each of the switching devices setting its data bus node logically low when activated responsive to a first logical signal value on the switching device control node, each of the switching devices decoupling its data bus node from the logical low signal when deactivated responsive to a second logical signal value on the switching device control node;

(e) for each of the pairs of switching devices, means including a plurality of logic gates of a first type for activating and deactivating the switching devices, comprising a first logic gate of the first type having an output node connected to the first switching device and a second logic gate of the first type having an output node connected to the second switching device, the first logic gate of the first type having a first input connected to a first memory data node and a second input connected to a enable node, the second logic gate of the first type having a first input connected to a second memory data node and a second input connected to the enable node;

(f) for each of the pairs of switching devices, means including a logic gate of a second type for selectively asserting a read enable signal on the enable node, and for selectively negating the read enable signal on the enable node, the logic gate of the second type having an output connected to the enable node, the logic gate of the second type having a first input connected to a read enable signal, the logic gate of the second type having a second input connected to the section enable signal;

(g) for each of the pairs of switching devices, means including a first one of the sense amplifiers for setting a first memory data signal on the first memory data node, and means including a second one of the sense amplifiers and a multiplexer for setting a second memory data signal on the second memory data node in normal operating mode, and for setting an inverse of the second memory data signal on the second memory data node in compression test mode.

13. The arrangement of claim 12, implemented in a complementary metal oxide semiconductor process technology, providing a semiconductor integrated circuit design in which the data bus nodes comprise a plurality of wires spanning a substantial fraction of the length of the memory device, the precharge devices comprise p-type transistors, the switching devices comprise n-type transistors, the logic gates of the first type comprise nor gates, and the logic gates of the second type comprise nand gates.

14. Within a memory device having a normal mode of operation and a compression test mode of operation, the memory device being partitioned into a plurality of sections which may be individually enabled for access during the normal mode of operation, a plurality of the sections capable of being simultaneously enabled for access during the compression test mode of operation, the memory device having a write cycle in both the normal operating mode and the test operating mode for writing a plurality of data to the memory device, the memory device having a read cycle in the normal operating mode for reading the data from the memory device, the memory device having a read cycle in the test operating mode for reading a compressed representation of the data from the memory device, the memory device having a plurality of memory cells for storing the data, and a plurality of sense amplifiers for sensing and conveying the data stored in the memory cells, each of the sense amplifiers having at least one data output node for conveying a memory data signal, the memory data signal on the data output node of each sense amplifier being responsive to a single binary digit of the data stored in a selected memory cell to which the sense amplifier is connected during the read cycle:

an arrangement of a plurality of active logic devices and a plurality of logic signal interconnections for conveying the memory data signals during the read cycle in the normal operating mode from the sense amplifiers to the data bus nodes, and for conveying a compressed representation of the memory data signals during the read cycle in the test operating mode from the sense amplifiers to the data bus nodes, the arrangement comprising:

(a) a plurality of pairs of the data bus nodes, each of the pairs of data bus nodes comprising a first data bus node and a second data bus node;

(b) a plurality of precharge devices, each of the data bus nodes having at least one precharge device, each precharge device connected to one data bus node, each precharge device when activated coupling its data bus node to a logical high signal, each precharge device when deactivated decoupling its data bus node from the logical high signal, each of the precharge devices being further connected to a common precharge signal such that each of the precharge devices is activated when the common precharge signal is asserted and is deactivated when the common precharge signal is negated;

(c) a plurality of bus-latches, each bus-latch being connected to one of the data bus nodes, at least one bus-latch being connected to each of the data bus nodes to prevent a logic signal on the data bus node from changing state when the data bus node is not actively connected to a particular logic value, each bus-latch comprising a first inverter having an input connected to the associated data bus node, and an output connected to a first intermediate node, and a second inverter having an input connected to the first intermediate node, and an output connected to the associated data bus node;

(d) for each of the pairs of data bus nodes, a plurality of pairs of switching devices, each of the pairs of switching devices being associated with one of the pairs of data bus nodes, each of the pairs of switching devices being associated with one of the memory sections, each of the pairs of switching devices comprising a first switching device connected between the first data bus node and a logical low signal and a second switching device connected between the second data bus node and the logical low signal, each switching device when activated setting its data bus node logically low, each switching device when deactivated decoupling its data bus node from the logical low signal;

(e) for each of the pairs of switching devices, a plurality of nor-gates comprising a first nor-gate and a second nor-gate, the first switching device connected to an output node of the first nor-gate such that when the output node of the first nor-gate is logically high the first switching device is activated, and when the output node of the first nor-gate is logically low the first switching device is deactivated, the first nor-gate having a first input connected to a first memory data node and a second input connected to an enable node, the second switching device connected to an output node of the second nor-gate such that when the output node of the second nor-gate is logically high the second switching device is activated, and when the output node of the second nor-gate is logically low the second switching device is deactivated, the second nor-gate having a first input connected to a second memory data node and a second input connected to the enable node;

(f) for each of the pairs of switching devices, a multiplexer having a first data input node and a second data input node, a control input node, and a data output node, the multiplexer coupling its data output node to its first data input node when its control input node is logically low, and coupling its data output node to its second data input node when its control input node is logically high; the data output node of the multiplexer being connected to the second memory data node, the control input node of the multiplexer being connected to a compression test mode enable signal, the compression test mode enable signal being asserted logically high when the memory is in compression test mode and negated when the memory is in normal mode;

(g) for each of the pairs of switching devices, a nand-gate having an output node connected to the enable node, the nand-gate having a first input node connected to a read enable signal and a second input node connected to a section enable signal, the read enable signal being asserted logically high during a memory read operation in normal mode and in compression test mode and negated logically low otherwise, the section enable signal being asserted logically high to enable the memory section associated with the pair of switching devices and negated logically low otherwise;

(h) for each of the pairs of switching devices, a plurality of sense amplifiers comprising a first sense amplifier and a second sense amplifier, the data output node of the first sense amplifier connecting to the first memory data node, the data output node of the second sense amplifier connecting to the first data input node of the multiplexer, an inverse of the memory data signal on the data output node of the second sense amplifier connecting to the second data input node of the multiplexer;

thereby providing the functionality in normal operating mode of conveying a pair of sense amplifier data values separately to the pair of data bus nodes, and in compression test mode of gating a plurality of pairs of sense amplifier data values onto the pair of data bus nodes such that when data having the same logical value is written to the memory and then read in compression test mode, complementary data values on each pair of data bus nodes indicate valid operation of the selected portion of the memory and equal data values indicate that an error has been detected somewhere in the selected portion of memory;

thereby providing memory read functionality in both normal operating mode and compression test mode using the same data bus nodes in both the compression test mode and the normal operating mode;

thereby providing a memory device having a compression test mode in which there is no fixed upper bound on the number of memory locations which may be tested simultaneously in a single memory access.

15. The arrangement of claim 14, implemented in a complementary metal oxide semiconductor process technology, providing an integrated circuit design in which:

each of the precharge devices comprises a p-type transistor having a drain contact connected to its data bus node, a source contact connected logically high, and a gate contact connected to the common precharge signal;

each of the switching devices comprises an n-type transistor having a drain contact connected to its associated data bus node, a source contact connected logically low, and a gate contact connected to the output node of its associated nor-gate; and each of the nor-gates, nand-gates, bus-latches and multiplexers comprise conventional logic devices known in the art.

16. Within a memory device having a normal mode of operation and a compression test mode of operation, the memory device being partitioned into a plurality of sections which may be individually enabled for access during the normal mode of operation, a plurality of the sections being simultaneously enabled for access during the compression test mode of operation, the memory device having a write cycle in both the normal operating mode and the test operating mode for writing a plurality of data to the memory device, the memory device having a read cycle in the normal operating mode for reading the data from the memory device, the memory device having a read cycle in the test operating mode for reading a compressed representation of the data from the memory device, the memory device having a plurality of memory cells for storing the data, and a plurality of sense amplifiers for sensing and conveying the data stored in the memory cells, each of the sense amplifiers having at least one data output node for conveying a memory data signal, the memory data signal on the data output node of each sense amplifier being responsive to a single binary digit of the data stored in a selected memory cell to which the sense amplifier is connected during the read cycle, the memory device having a plurality of pairs data bus nodes, each pair of data bus nodes comprising a first data bus node and a second data bus node, each pair of data bus nodes being associated with a plurality of pairs of sense amplifiers, each of the pairs of sense amplifiers associated with any one pair of data bus nodes being in a separate one of the memory sections, each pair of sense amplifiers comprising a first sense amplifier associated with the first data bus node and a second sense amplifier associated with the second data bus node:

a method for conveying a plurality of data values from the sense amplifiers to the data bus nodes during the read cycle, comprising the steps of:

(a) setting the data bus nodes to a first logic value prior to a read operation;

(b) decoupling the data bus nodes from the first logic value at the outset of the read operation;

(c) retaining the first logic value on the data bus nodes by utilizing a bus-latch coupled to each of the data bus nodes;

(d) enabling a plurality of signal paths permitting signals on the output node of each of a predetermined set of sense amplifiers to switch the logic value of its associated data bus node to a second logic value; and (e) for each of the pairs of data bus nodes, selectively switching the first data bus node and the second data bus node such that during the normal mode read cycle the memory data signal on the data output node of the first sense amplifier in the single enabled section associated with the pair of data bus nodes is conveyed to the first data bus node, and the memory data signal on the data output node of the second sense amplifier in the single enabled section associated with the pair of data bus nodes is conveyed to the second data bus node; and during the compression test mode read cycle the first data bus node is set to a logical-nor evaluation of the memory data signal on the data output node of each of the first sense amplifiers of the pair of enabled sense amplifiers in each of the plurality of enabled sections associated with the pair of data bus nodes, and during a compression test mode read cycle the second data bus node is set to a logical-nor evaluation of an inverse of the memory data signal on the data output node of each of the second sense amplifiers of the pairs of enabled sense amplifiers in the plurality of enabled sections associated with the pair of data bus nodes.

17. Within a memory device comprising an array of memory cells and a plurality of sense amplifiers, the memory device having a normal mode of operation and a compression test mode of operation, the memory device having a write cycle in both the normal mode of operation and the compression test mode of operation for writing a plurality of data values to the memory, the memory device having a read cycle in the normal mode of operation for reading the data values from the memory, the memory device having a read cycle in the compression test mode of operation for reading a compressed representation of the data values from the memory, the memory device being partitioned into a plurality of sections which may be individually enabled for access during the normal mode of operation, a plurality of the sections capable of being simultaneously enabled for access during the compression test mode of operation, each of the sense amplifiers having at least one data output node responsive to the state of a selected memory cell connected to the sense amplifier during a memory read operation;

an arrangement of active logic devices and logic signal interconnections for conveying a plurality of data output signals from the sense amplifiers to a plurality of data bus nodes, the data bus nodes connecting to active logic devices disposed substantially adjacent to the sense amplifiers, the arrangement supporting the normal mode of operation and the compression test mode of operation, the arrangement containing no passive devices, comprising:

(a) a plurality of pairs of data bus nodes, each pair comprising a first data bus node and a second data bus node;

(b) for each of the pairs of data bus nodes, a plurality of pairs of the sense amplifiers, each of the pairs of sense amplifiers associated with one pair of data bus nodes, each of the pairs of sense amplifiers comprising a first sense amplifier and a second sense amplifier, each of the pairs of sense amplifiers having means including a combinational network of logic devices and logic signal interconnections for selectively coupling the output node of each sense amplifier of each pair of sense amplifiers to a separate one of the associated pair of data bus nodes, the combinational logic network comprising individual, separately enabled signal paths for the normal mode of operation and for the compression test mode of operation;

the combinational logic network during a read cycle in the normal mode of operation having means including logic gates and switching devices for coupling a signal from the data output node of the first sense amplifier to the first data bus node and for coupling a signal from the data output node of the second sense amplifier to the second data bus node, the pair of sense amplifiers being in the single enabled section associated with the pair of data bus nodes during a normal mode read operation;

the combinational logic network during the read cycle in the compression test mode of operation having means including a compression circuit and switching devices for coupling complementary logic values onto its pair of data bus nodes when the memory cells connected to all the pairs of sense amplifiers in simultaneously enabled sections associated with the pair of data bus nodes have been written previously with the same logic value, and the sense amplifiers during the compression test mode read cycle have correctly sensed that logic value;

the combinational logic network during a read cycle in the compression test mode of operation having means including a compression circuit and switching devices for coupling equal logic values onto its pair of data bus nodes when the memory cells connected to all the pairs of sense amplifiers associated with the pair of data bus nodes have been written previously with the same logic value, and the sense amplifiers during the compression test mode read cycle have not correctly sensed that logic value, and (c) means including a precharge signal and at least one precharge device for each of the data bus nodes, for setting the data bus nodes simultaneously to a logical high value when the precharge signal is asserted at the outset of a read cycle, and for decoupling the data bus nodes from the logically high signal and from each other when the precharge signal is negated during the remainder of the read cycle.

18. The combinational logic network of claim 17, wherein each of the sense amplifiers has complementary outputs comprising a non-inverting output node and an inverting output node, with first means including a nor-gate, an inverter, and a plurality of nand-gates, for enabling the normal mode signal path during the read cycle in the normal operating mode and disabling the compression test mode signal path, and for enabling the compression test mode signal path and disabling the normal mode signal path during the read cycle in the test operating mode;

with second means including a plurality of nor-gates and a plurality of switching devices, for coupling, when enabled during the read cycle in the normal operating mode, a first logic signal from the non-inverting output node of the first sense amplifier to the first data bus node, and for coupling, when enabled during a read cycle in the normal operating mode, a second logic signal from the non-inverting output node of the second sense amplifier to the second data bus node; and with third means including a compression logic network and a plurality of switching devices, for coupling, when enabled during the read cycle in the test operating mode, a plurality of signals from the inverting output nodes of the pairs of sense amplifiers in a plurality of enabled sections associated with a pair of read-write data nodes, to the pair of data bus nodes.

19. The combinational logic network of claim 18, wherein the first means comprises:
   (a) a read-enable-bar node, set logically low during a read cycle and logically high otherwise,
   (b) a section-enable-bar node, set logically low to enable the section associated with the pair of sense amplifiers and the combinational logic network, and logically high otherwise,
   (c) a compression test mode enable node, set logically high during a compression test mode read cycle and logically low otherwise,
   (d) a nor-gate having a first input connected to the read-enable-bar node, a second input connected to the section-enable bar node, and an output connected to a read-enable node,
   (e) an inverter having an input connected to the test mode enable node, and an output connected to a test mode enable-bar node,
   (f) a first nand-gate having a first input connected to the read-enable node, a second input connected to the compression test mode enable node, and an output connected to a compression test mode read enable-bar node,
   (g) a second nand-gate having a first input connected to the read-enable node, a second input connected to the compression test mode enable-bar node, and an output connected to a normal mode read enable-bar node.

20. The combinational logic network of claim 19, implemented in a complementary metal oxide semiconductor process technology, in which the nor-gate, the first nand-gate, the second nand-gate, and the inverter comprise conventional known devices in the technology.

21. The combinational logic network of claim 18, wherein the second means comprises:
   (a) a first nor-gate having a first input connected to the non-inverting output node of the first sense amplifier, a second input connected to the normal mode read enable-bar node, and an output connected to a first data-bar node,
   (b) a first switching device connected between the first data bus node and the logical low signal, the first switching device being connected to the first data-bar node such that when the first data-bar node is logically high, the first switching device is activated and switches the first data bus node logically low, and when the first data-bar node is logically low, the first switching device is inactive and decouples the first data bus node from the logically low signal,
   (c) a second nor-gate having a first input connected to the non-inverting output node of the second sense amplifier, a second input connected to the normal mode read enable-bar node, and an output connected to a second data-bar node,
   (d) a second switching device connected between the second data bus node and the logical low signal, the second switching device being connected to the second data-bar node such that when the second data-bar node is logically high, the second switching device is activated and switches the second data bus node logically low, and when the second data-bar node is logically low, the second switching device is inactive and does not connect the second data bus node to the logically low signal.

22. The combinational logic network of claim 21, implemented in a complementary metal oxide semiconductor process technology, in which the first nor-gate and the second nor-gate are conventional, known devices in the technology, the first switching device and the second switching device comprise a plurality of n-type transistors each having a drain contact connected respectively to its associated data bus node, a gate contact connected respectively to the associated data-bar node, and a source contact connected logically low.

23. The combinational logic network of claim 18, wherein the third means comprises:
   (a) a compression logic network having a first input node connected to the inverting output node of the first sense amplifier, a second input node connected to the inverting output node of the second sense amplifier, a control input node connected to the test mode read enable-bar node, a first compression device output node, and a second compression device output node; and
   (b) a plurality of switching devices comprising a first switching device connected between the first data bus node and a logical low signal, the first switching device being connected to the first compression logic network output node such that when the first compression logic network output node is logically high, the first switching device connects the first data bus node logically low, and when the first compression logic network output node is logically low, the first switching device decouples the first data bus node from the logically low signal; and a second switching device connected between the second data bus node and the logical low signal, the second switching device being connected to the second compression logic network output node such that when the second compression logic network output node is logically high, the second switching device connects the second data bus node logically low, and when the second compression logic network output node is logically low, the second switching device decouples the second data bus node from the logically low signal.

24. The combinational logic network of claim 23, implemented in a complementary metal oxide semiconductor process technology, in which:
   (a) the first switching device and the second switching device comprise a plurality of n-type transistors each having a drain contact connected to its associated data bus node, a gate contact connected to its respective compression logic network output node, and a source contact connected logically low, and
   (b) the compression logic network comprises the first compression logic network output node connected to an output of a first inverter, the second compression logic network output node connected to an output of a second inverter, an input of the first inverter connected to an output of a third inverter, an input of the third inverter connected to a first internal node, an input of the second inverter connected to a second internal node;

the first internal node connected to the drains of a first p-type transistor, a second p-type transistor, a first n-type transistor, and a second n-type transistor; a gate of the first p-type transistor connected to the first input node, a gate of the second p-type transistor connected to the second input node, a gate of the first n-type transistor connected to the first input node, a gate of the second n-type transistor connected to the control input node, a source of the first p-type transistor connected to a fourth internal node, a source of the second p-type transistor connected to the fourth internal node, the fourth internal node further coupling to a drain of a third p-type transistor, a gate of the third p-type transistor coupling to the control input node, a source of the third p-type transistor connected logically high, a source of the first n-type transistor connected to a drain of a third n-type transistor, a gate of the third n-type transistor connected to the second input node, the source of the third n-type transistor connected logically low, the source of the second n-type transistor connected logically low;

the second internal node coupling to the drains of a fourth p-type transistor, a fifth p-type transistor, a fourth n-type transistor, and a fifth n-type transistor; a gate of the fourth p-type transistor connected to a third internal node, a gate of the fifth p-type transistor connected to the first input node, a gate of the fourth n-type transistor connected to the second input node, a gate of the fifth n-type transistor connected to the first input node, a source of the fourth p-type transistor connected logically high, a source of the fifth p-type transistor connected to a drain of a sixth p-type transistor, a gate of the sixth p-type transistor connected to the second input node, a source of the sixth p-type transistor connected logically high, a source of the fourth n-type transistor connected to a fifth internal node, a source of the fifth n-type transistor connected to the fifth internal node, the fifth internal node further connected to a drain of a sixth n-type transistor, a gate of the sixth n-type transistor connected to the third internal node, a source of the sixth n-type transistor connected logically low;

the third internal node connected to an output of a fourth inverter, an input of the fourth inverter connected to the control input node.

* * * * *